United States Patent
Funatsu et al.

(10) Patent No.: US 9,778,568 B2
(45) Date of Patent: Oct. 3, 2017

(54) POSITIVE RESIST COMPOSITION AND PATTERNING PROCESS

(71) Applicant: SHIN-ETSU CHEMICAL CO., LTD., Tokyo (JP)

(72) Inventors: Kenji Funatsu, Joetsu (JP); Akihiko Seki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 11 days.

(21) Appl. No.: 15/147,944

(22) Filed: May 6, 2016

(65) Prior Publication Data

US 2016/0327864 A1    Nov. 10, 2016

(30) Foreign Application Priority Data

May 7, 2015    (JP) ................................. 2015-094749

(51) Int. Cl.
| | | |
|---|---|---|
| *G03F 7/039* | (2006.01) | |
| *G03F 7/004* | (2006.01) | |
| *G03F 7/11* | (2006.01) | |
| *G03F 7/20* | (2006.01) | |
| *G03F 7/32* | (2006.01) | |

(52) U.S. Cl.
CPC .......... *G03F 7/0397* (2013.01); *G03F 7/0045* (2013.01); *G03F 7/0046* (2013.01); *G03F 7/11* (2013.01); *G03F 7/2041* (2013.01); *G03F 7/322* (2013.01)

(58) Field of Classification Search
None
See application file for complete search history.

(56) References Cited

U.S. PATENT DOCUMENTS

| | | | |
|---|---|---|---|
| 7,144,675 B2 | 12/2006 | Shima et al. | |
| 2014/0255843 A1* | 9/2014 | Kobayashi | G03F 7/40 430/270.1 |
| 2015/0323865 A1* | 11/2015 | Sagehashi | C08F 228/02 430/285.1 |

FOREIGN PATENT DOCUMENTS

JP    4877306 B2    2/2012

OTHER PUBLICATIONS

Owa et al., "Immersion lithography; its potential performance and issues", Optical Microlithography XVI, Proceedings of SPIE vol. 5040, pp. 724-733, 2003.

* cited by examiner

*Primary Examiner* — Sin Lee
(74) *Attorney, Agent, or Firm* — Westerman, Hattori, Daniels & Adrian, LLP

(57) ABSTRACT

A positive resist composition is provided comprising (A) a resin comprising recurring units having adamantane ring and recurring units having cyclopentyl so that the resin may increase its alkali solubility under the action of acid, (B) a mixture of sulfonium salts, and (C) a solvent. By coating the resist composition as a resist film, forming a protective film thereon, and effecting immersion lithography, a pattern of good profile is formed at a high resolution.

8 Claims, No Drawings

POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2015-094749 filed in Japan on May 7, 2015, the entire contents of which are hereby incorporated by reference.

TECHNICAL FIELD

This invention relates to a positive resist composition and a patterning process using the same.

BACKGROUND ART

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. The theoretically possible maximum NA is 1.35. The resolution is improved by an increment of NA. A combination of a lens having NA of at least 1.2 with ultra-high resolution technology suggests a way to the 45-nm node (see Non-Patent Document 1).

In conjunction with the immersion lithography, several problems arising from the presence of water on the resist film are pointed out. For example, since the resist film is in contact with water, a photoacid generator in the resist composition, an acid generated therefrom upon exposure, and an amine compound added to the resist film as a quencher can be leached in water. Such leaching causes changes of the pattern profile and contamination of the projection lens of the exposure tool.

The problem may be solved by forming a protective film for restraining leaching. Although the protective film is effective for restraining leaching, another problem arises that the protective film adversely affects pattern profile and resolution. The problem pertaining to pattern profile is that the pattern is rounded at the top, known as top-loss.

As the demand for high resolution increases, further improvements in lithography properties are desired. Among others, the pattern formation process needs further improvements in depth of focus (DOF) and line width roughness (LWR) for gaining a wider process margin.

The resist material adapted for the ArF excimer laser lithography must have satisfactory resist properties including transparency at wavelength 193 nm, sensitivity, resolution, dry etching resistance, and pattern profile. As the resist material having satisfactory fundamental properties, Patent Document 1 proposes a resist composition comprising a base resin in the form of a poly(meth)acrylic acid derivative having a bulky acid-decomposable protective group (typically 2-ethyl-2-adamantyl or 2-methyl-2-adamantyl) and a monocyclic acid-decomposable protective group capable of effective removal (typically 1-methylcyclopentyl or 1-methylcyclohexyl) and a sulfonium salt of naphthalene skeleton (typically 1-(4-n-butoxynaphthyl)tetrahydrothiophenium nonafluoro-n-butanesulfonate). This resist composition may be adjusted in sensitivity and dry etching resistance to some extent by changing the ratio of the acid-dissociable group of adamantyl structure to the acid-dissociable group of cyclopentyl or cyclohexyl structure. However, since the sulfonium salt of nonafluoro-n-butanesulfonate has a low acid diffusion controlling ability, the resist composition is not sufficient with respect to the DOF of removal (grouped pattern) performance and retention (isolated pattern) performance. Specifically, when the ratio of the acid-dissociable group of adamantyl structure is increased, the retention performance is secured, but the removal performance and LWR are degraded. When the ratio of the acid-dissociable group of cyclopentyl or cyclohexyl structure is increased, the removal performance is secured, but the retention performance and pattern profile are degraded. That is, the resist composition is not satisfactory when the trend toward further miniaturization is considered. In the immersion lithography, the sulfonium salt of nonafluoro-n-butanesulfonate is leached out more, which is also a problem.

CITATION LIST

Patent Document 1: JP 4877306 (U.S. Pat. No. 7,144,675)
Non-Patent Document 1: Proc. SPIE Vol. 5040 p 724

DISCLOSURE OF INVENTION

An object of the invention is to provide a positive resist composition having a high resolution, especially improved DOF, and forming a pattern with improved LWR, and a pattern forming process by immersion lithography involving formation of a protective film and light exposure through water.

In one aspect, the invention provides a positive resist composition comprising (A) a resin comprising acid labile group-containing recurring units so that the resin may increase its alkali solubility under the action of acid, (B) a sulfonium salt, and (C) a solvent. The resin (A) comprises recurring units having the general formula (1) and recurring units having the general formula (2) as the acid labile group-containing recurring units,

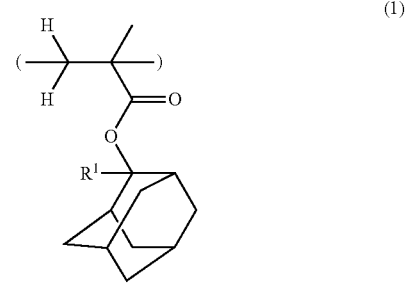

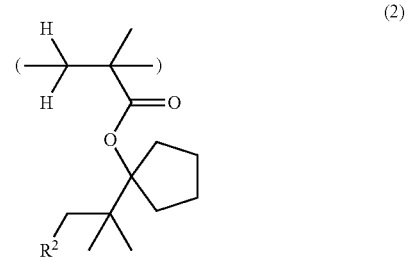

wherein $R^1$ is methyl or ethyl, and $R^2$ is hydrogen or methyl. Component (B) is a mixture of a sulfonium salt having the general formula (3) and a sulfonium salt having the general formula (4):

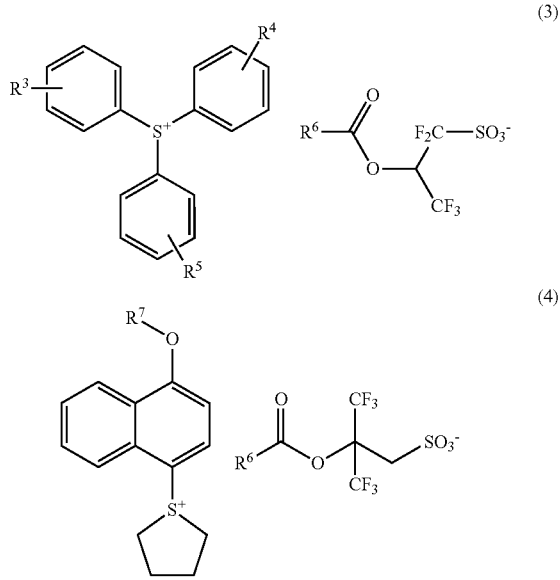

wherein $R^3$, $R^4$ and $R^5$ are each independently hydrogen or a straight, branched or cyclic $C_1$-$C_{20}$ monovalent hydrocarbon group which may contain a heteroatom, $R^6$ is each independently a straight, branched or cyclic $C_7$-$C_{30}$ monovalent hydrocarbon group which may contain a heteroatom, and $R^7$ is each independently hydrogen or a straight, branched or cyclic $C_1$-$C_{30}$ monovalent hydrocarbon group which may contain a heteroatom.

The positive resist composition constructed as above has a high resolution and is improved in DOF with respect to removal (grouped pattern) performance and retention (isolated pattern) performance. From the resist composition, a resist film is formed, from which a pattern with improved LWR is formed.

In a preferred embodiment, the resin as component (A) further comprises recurring units having the general formula (5):

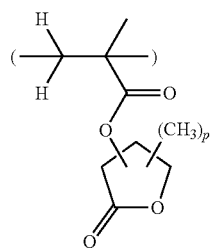

wherein p is 0, 1 or 2.

In the embodiment using the resin (A) comprising lactone ring-bearing recurring units of formula (5), a resist film having better adhesion is formed, from which a pattern of better profile is formed.

In a preferred embodiment, component (B) is present in an amount of 0.5 to 10 parts by weight per 100 parts by weight of component (A). An amount of component (B) in the range ensures that the composition fully exerts its function.

In another aspect, the invention provides a pattern forming process comprising the steps of applying the positive resist composition defined above onto a substrate, baking to form a photoresist film, forming a protective film on the photoresist film, exposing the photoresist film to high-energy radiation of wavelength 180 to 250 nm through water by immersion lithography, and developing the resist film in an alkaline developer.

This pattern forming process eliminates or minimizes a possibility of degradation of pattern profile and resolution which would be otherwise caused by the immersion lithography using a protective film. Specifically, a pattern of a substantially rectangular profile can be formed, and the DOF performance is improved, especially the DOF performance of both grouped and isolated patterns is improved.

Preferred embodiments of the process are the same as those of the composition, with the same advantages.

Advantageous Effects of Invention

The positive resist composition of the invention has a high resolution and is improved in DOF performance independent of whether the pattern is an isolated one or a grouped one. Also advantageously, a resist pattern with improved LWR is formed. The positive resist composition is especially useful in forming a pattern by the immersion lithography involving formation of a protective film and exposure through water. The pattern forming process eliminates or minimizes a possibility of degradation of pattern profile and resolution which would be otherwise caused by the immersion lithography using a protective film. Specifically, a pattern of a substantially rectangular profile can be formed. The DOF performance is improved, especially the DOF performance of both grouped and isolated patterns is improved.

DESCRIPTION OF PREFERRED EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In the chemical formulae, Me stands for methyl, and Ac for acetyl.

The abbreviations and acronyms have the following meaning.

Mw: weight average molecular weight
Mn: number average molecular weight
Mw/Mn: molecular weight distribution or dispersity
GPC: gel permeation chromatography
PAG: photoacid generator
PEB: post-exposure bake
LWR: line width roughness
DOF: depth of focus As alluded to previously, there is a need for a positive resist composition which is processed to form a resist pattern without raising problems like top-loss even when a protective film is formed thereon, and is effective for preventing any degradation of pattern profile and resolution, especially DOF.

The inventors have found that a positive resist composition comprising (A) a resin comprising recurring units in which carboxylic acid as dissolvable group is protected with a tertiary ester type acid labile group having adamantane ring (i.e., recurring units of formula (1)) and recurring units in which a tertiary ester type acid labile group is a cyclopentyl group having tert-butyl or tert-amyl pendant (i.e., recurring units of formula (2)), (B) a mixture of a sulfonium salt having formula (3) and a sulfonium salt having formula (4), and (C) a solvent is improved in resolution and rectangularity of pattern profile. Thus the resist composition is best suited in precise micropatterning.

The positive resist composition of the invention is improved in DOF performance independent of whether the pattern is an isolated one or a grouped one. Provided that exposure is made in an identical dose while the focus is vertically shifted, the term "DOF" refers to the range of focus that enables to form a resist pattern to a feature size, a deviation of which from the target size falls within a predetermined range, that is, the range of focus that ensures to form a resist pattern substantially faithful to the mask pattern. A larger magnitude of DOF is preferable.

The positive resist composition is defined as comprising (A) a resin comprising acid labile group-containing recurring units so that the resin may increase its alkali solubility under the action of acid, specifically the resin (A) comprising recurring units having the general formula (1) and recurring units having the general formula (2).

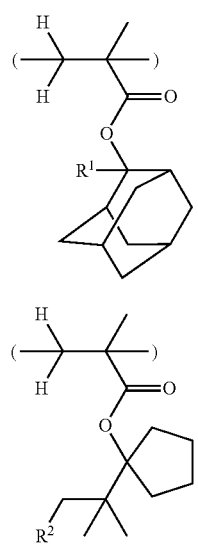

Herein $R^1$ is methyl or ethyl, and $R^2$ is hydrogen or methyl.

The recurring unit having formula (1), which is one of acid labile group-containing recurring units, is the unit in which carboxylic acid as dissolvable group is protected with a tertiary ester type acid labile group having adamantane ring. By incorporating the recurring unit of formula (1) as a constituent unit in a resin adapted to increase its alkali solubility under the action of acid, satisfactory retention performance (DOF of an isolated pattern) is obtainable. When the unit of formula (1) is used alone, however, removal performance and LWR are degraded despite satisfactory retention performance. Although isopropyl-2-adamantyl methacrylate may also be used as the acid labile group, it is too less homo-polymerizable or copolymerizable to form a polymer with a desired molecular weight. A lowering of molecular weight leads to a lowering of acid diffusion suppressing ability, which in turn, invites undesirable reductions of DOF and LWR of an isolated pattern.

The recurring unit having formula (2), which is another acid labile group-containing recurring unit, is the unit in which a tertiary ester type acid labile group is a cyclopentyl group having tert-butyl or tert-amyl pendant. By incorporating the highly branched structural unit of cyclopentyl having tert-butyl or tert-amyl pendant as a constituent unit in a resin adapted to increase its alkali solubility under the action of acid, the dissolution contrast of resist can be enhanced due to moderate lipophilicity and very high acid eliminatability of the acid-dissociable group having cyclopentyl structure. When such component (A) is combined with component (B) to be described below, there is obtained a positive resist composition which forms a pattern with high resolution, especially excellent removal performance (DOF of a grouped pattern), and improved LWR. As compared with the tertiary ester type acid labile group with tert-butyl or tert-amyl pendant, a tertiary ester type acid labile group in the form of a cyclopentyl group having methyl, ethyl, isopropyl or n-butyl pendant is unsatisfactory in that the pattern profile is degraded due to reductions of lipophilicity, acid diffusion control and acid elimination, and hence, DOF performance is degraded, especially DOF of an isolated pattern is reduced.

Examples of the recurring unit having formula (1) are shown below.

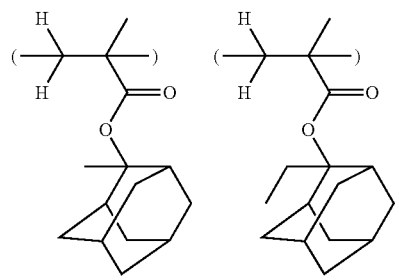

Examples of the recurring unit having formula (2) are shown below.

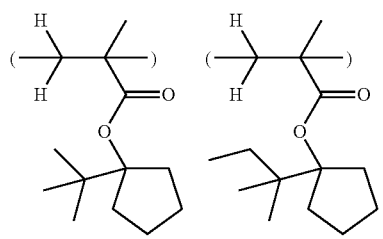

In addition to the recurring units having formula (1) and the recurring units having formula (2), the resin (A) preferably further comprises recurring units having the general formula (5). Inclusion of recurring units containing a lactone ring is effective for rendering the resist film more adherent to the substrate in forming a fine size pattern.

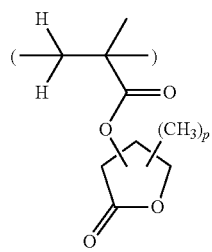

Herein p is 0, 1 or 2.

Examples of the recurring unit having formula (5) are shown below, but not limited thereto.

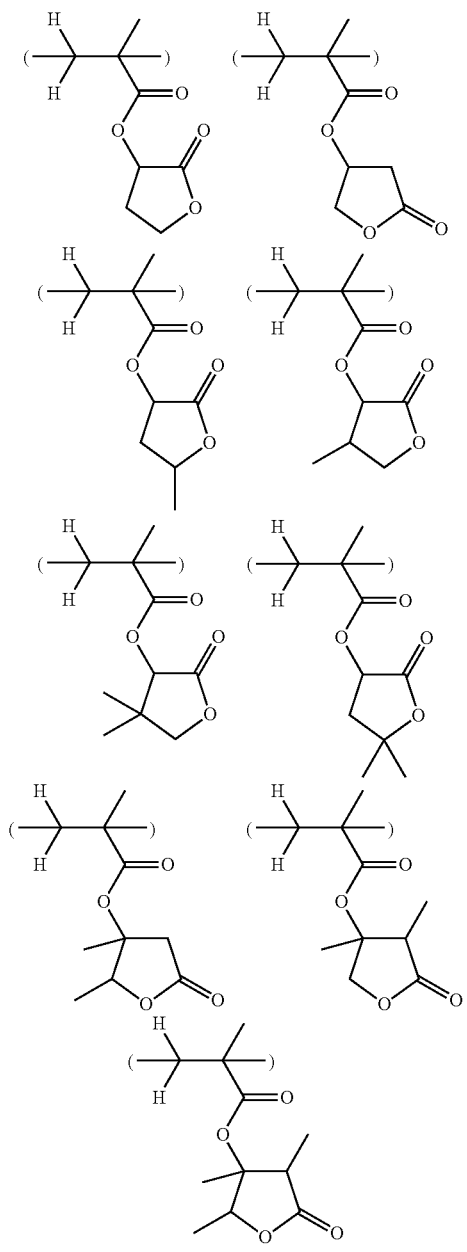

In addition to the recurring units having formulae (1), (2) and (5), the resin (A) may further comprise recurring units having a fused lactone ring. With fused lactone ring-containing recurring units incorporated, the resin becomes easier to adjust rectangularity in forming a fine size pattern. The content of the fused lactone ring-containing recurring unit should preferably be up to 20 mol % based on the total recurring units. Within this range, the risk of pattern collapse resistance and LWR being degraded due to swell is eliminated. Although the fused lactone ring-containing recurring unit is optional, the content of this unit, when incorporated, is preferably at least 3 mol %, more preferably 5 to 15 mol %.

Examples of the fused lactone ring-containing recurring unit are shown below, but not limited thereto.

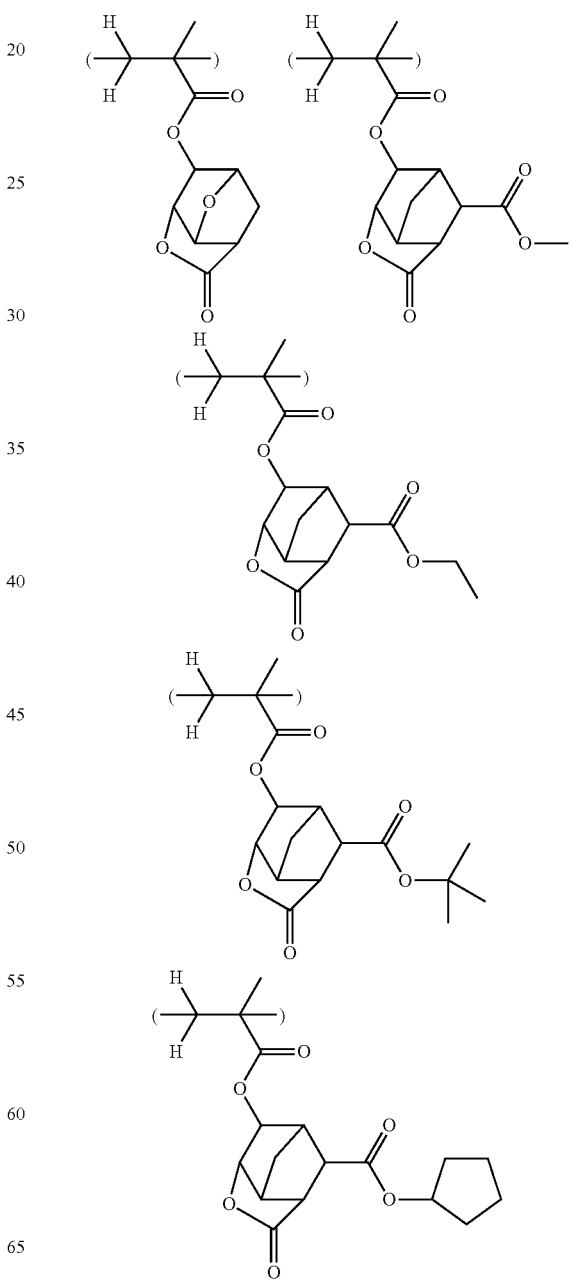

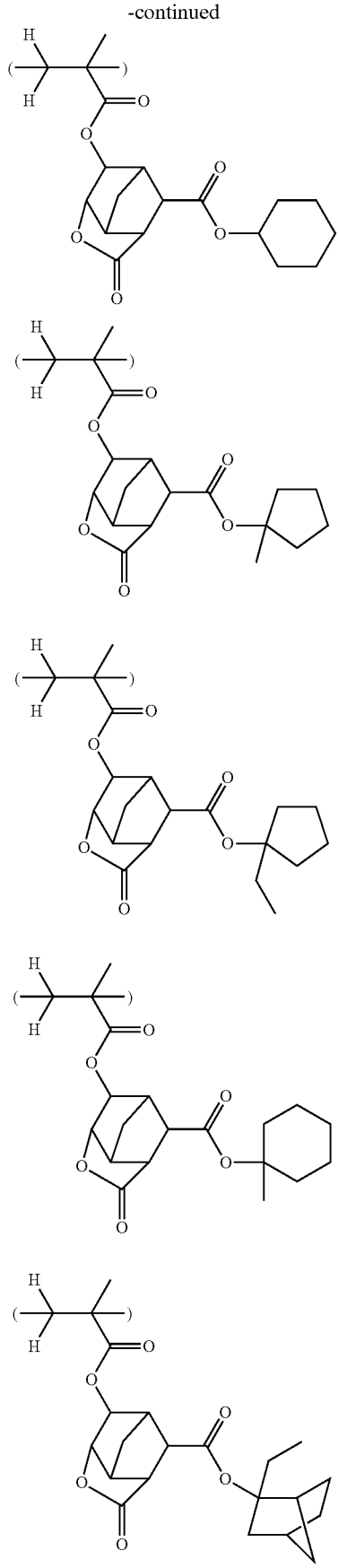

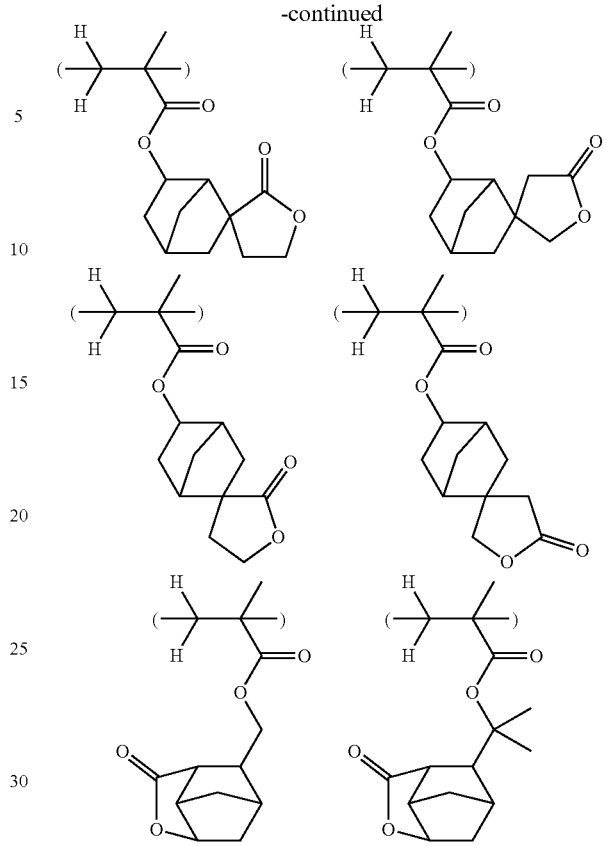

In addition to the recurring units having formulae (1) and (2) and lactone ring-containing recurring units, the resin as component (A) may further comprise other recurring units, if necessary, for example, units containing carboxyl and fluoroalkyl groups. The content of the carboxyl-containing recurring unit should preferably be up to 10 mol % based on the total recurring units. This range avoids any detrimental impact on pattern rectangularity, eliminates the risk of pattern collapse resistance being degraded due to swell, and is sometimes effective for dissolution rate control.

Also, units having a bridged ring structure (excluding units of formula (1) and fused lactone ring-containing units) may be incorporated in the resin. As long as the content of the bridged ring structure-containing recurring unit is less than 10 mol % based on the total recurring units, no detrimental effects are exerted on pattern collapse upon development and LWR.

Examples of the carboxyl-containing unit, fluoroalkyl-containing unit and bridged ring structure-containing unit are shown below, but not limited thereto.

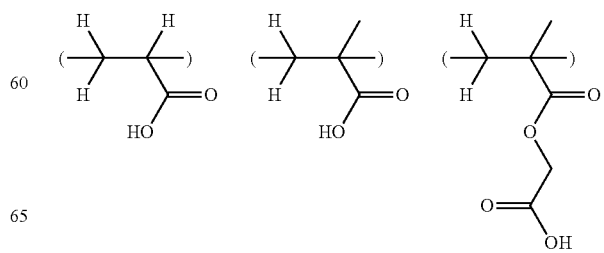

-continued

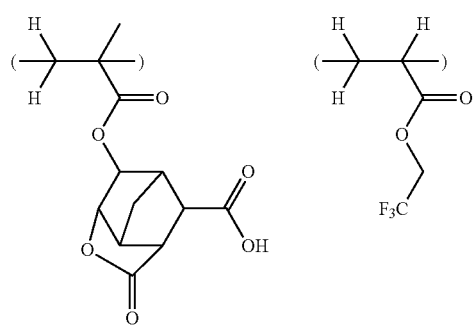

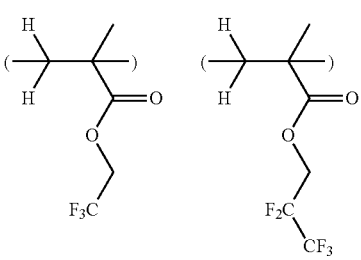

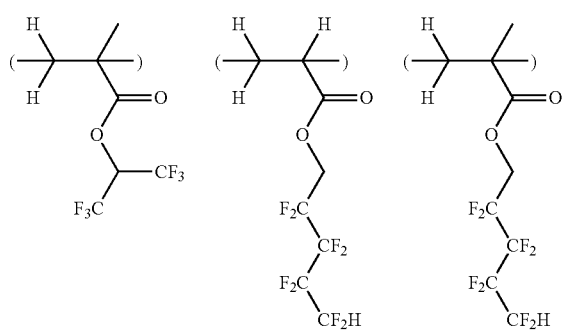

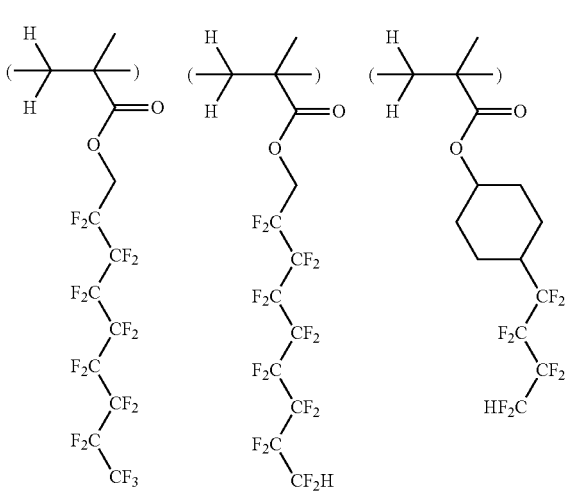

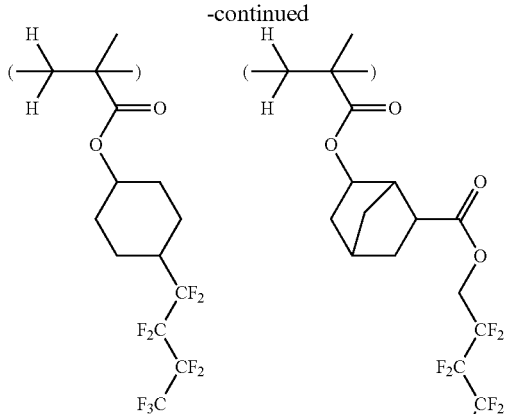

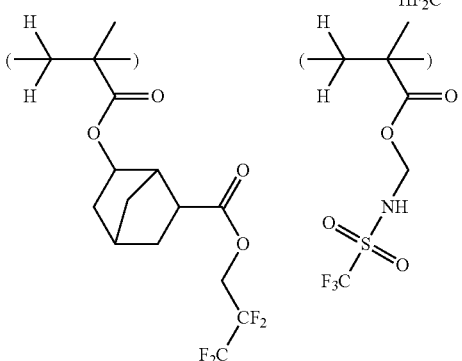

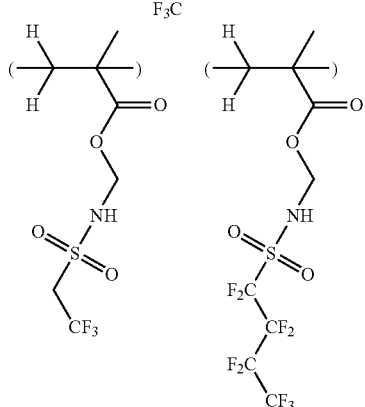

The resin as component (A) may be synthesized, for example, by mixing and dissolving suitable monomers selected from monomers corresponding to the essential recurring units having formulae (1) and (2), lactone units having formula (5), and other optional units in an organic solvent and effecting polymerization by the batch polymerization or dropwise polymerization method while adding a polymerization initiator or chain transfer agent if necessary.

As the polymerization initiator, any commercially available radical polymerization initiators may be used. The preferred radical polymerization initiators are azo and peroxide initiators. The initiators may be used alone or in admixture. The amount of the initiator used may be selected in accordance with the desired molecular weight, monomers, and synthesis conditions such as polymerization temperature and polymerization mode.

Of the polymerization initiators, suitable azo initiators include 2,2'-azobisisobutyronitrile (AIBN), 2,2'-azobis(2,4- dimethylvaleronitrile), dimethyl 2,2'-azobis(2-methylpropionate), 2,2'-azobis(4-methoxy-2,4-dimethylvaleronitrile), 2,2'-azobis(cyclohexane-1-carbonitrile), and 4,4'-azobis(4-cyanovaleric acid); and suitable peroxide initiators include benzoyl peroxide, decanoyl peroxide, lauroyl peroxide, succinic acid peroxide, tert-butyl peroxy-2-ethylhexanoate, tert-butyl peroxypivaloate, and 1,1,3,3-tetramethylbutyl peroxy-2-ethylhexanoate.

As the chain transfer agent, any commercially available agents may be used. Among others, thiol compounds are preferred, including well-known primary, secondary and tertiary thiol compounds. The chain transfer agent may be used alone or in admixture. The amount of the chain transfer agent used may be selected in accordance with the desired molecular weight, monomers, and synthesis conditions such as polymerization temperature and polymerization mode. Exemplary chain transfer agents include 1-octanethiol, 2-mercaptoethanol, thiolactic acid, thioglycolic acid, mercaptopropionic acid, cyclohexyl mercaptan, t-dodecyl mercaptan, 1,4-butanedithiol, 1,8-octanedithiol, butanediol bis(thioglycolate), hexanediol bis(thioglycolate), 1,3,5-benzenetrithiol, trimethyloipropane tris(thioglycolate), and pentaerythritol tetrakis(thioglycolate).

Any solvent may be used for polymerization as long as monomers are dissolvable therein and a polymer produced by polymerization reaction does not precipitate during polymerization reaction. Suitable solvents include ketones such as acetone, methyl ethyl ketone, methyl isobutyl ketone, methyl isopentyl ketone, methyl pentyl ketone, cyclohexanone; alcohols such as isopropyl alcohol, isobutyl alcohol, n-butyl alcohol, isopentyl alcohol; ether alcohols such as ethylene glycol monomethyl ether, ethylene glycol monoethyl ether, propylene glycol monomethyl ether, propylene glycol monoethyl ether; esters such as methyl acetate, ethyl acetate, isopropyl acetate, propyl acetate, butyl acetate, methyl propionate, methyl lactate, ethyl lactate, ethylene glycol monomethyl ether acetate, ethylene glycol monoethyl ether acetate, propylene glycol monomethyl ether acetate, propylene glycol monoethyl ether acetate; ethers such as tetrahydrofuran, 1,4-dioxane, ethylene glycol dimethyl ether; aromatic hydrocarbons such as toluene, xylene; N,N-dimethylformamide, acetonitrile, etc.

While the resin (A) is composed of recurring units as defined above, they are preferably incorporated in the following compositional ratio. Provided that a total content of recurring units having formula (1) is "a" mol %, a total content of recurring units having formula (2) is "b" mol %, and a total content of recurring units containing lactone ring is "c" mol %, the compositional ratio of recurring units in the resin preferably meets: a+b+c=100 mol %, 5<a≤50, 5≤b≤60, and 20≤c≤70, more preferably a+b+c=100 mol %, 10<a≤40, 10≤b≤60, and 30≤c≤60.

The resin (A) should preferably have a weight average molecular weight (Mw) in the range of 1,000 to 500,000, and more preferably 7,000 to 13,000, as measured by GPC versus polystyrene standards. A resin with too low a Mw may be soluble in water whereas a resin with too high a Mw has a possibility of losing alkaline solubility or causing defects during spin coating.

Also essentially the positive resist composition comprises a mixture of a sulfonium salt having the general formula (3) and a sulfonium salt having the general formula (4) as component (B).

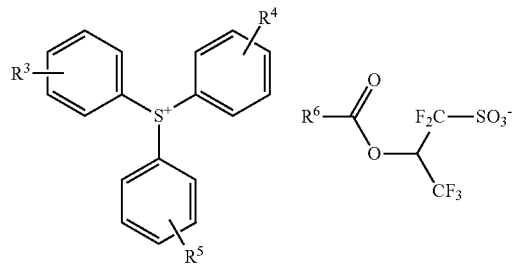

(3)

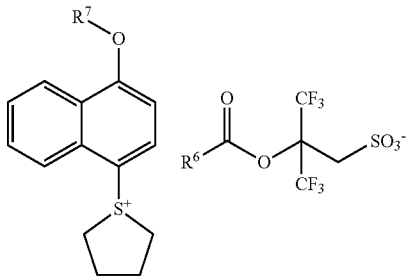

(4)

Herein $R^3$, $R^4$ and $R^5$ are each independently hydrogen or a straight, branched or cyclic $C_1$-$C_{20}$ monovalent hydrocarbon group which may contain a heteroatom, $R^6$ is each independently a straight, branched or cyclic $C_7$-$C_{30}$ monovalent hydrocarbon group which may contain a heteroatom, and $R^7$ is each independently hydrogen or a straight, branched or cyclic $C_1$-$C_{30}$ monovalent hydrocarbon group which may contain a heteroatom.

Examples of groups $R^3$, $R^4$ and $R^5$ in formula (3) include methyl, ethyl, n-propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl. Also included are substituted forms of the foregoing in which a heteroatom group such as —O—, —S—, —SO—, —SO$_2$—, —NH—, —C(=O)—, —C(=O)O— or —C(=O)NH— intervenes in any carbon-carbon bond, or any hydrogen atom is substituted by a functionality such as —OH, —NH$_2$, —CHO or —CO$_2$H.

Examples of the group $R^6$ in formulae (3) and (4) are shown below, but not limited thereto.

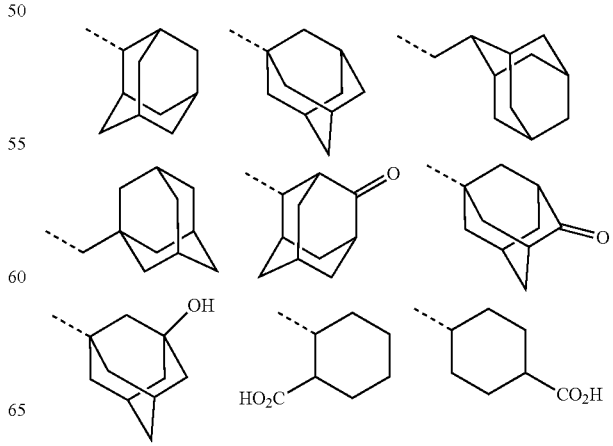

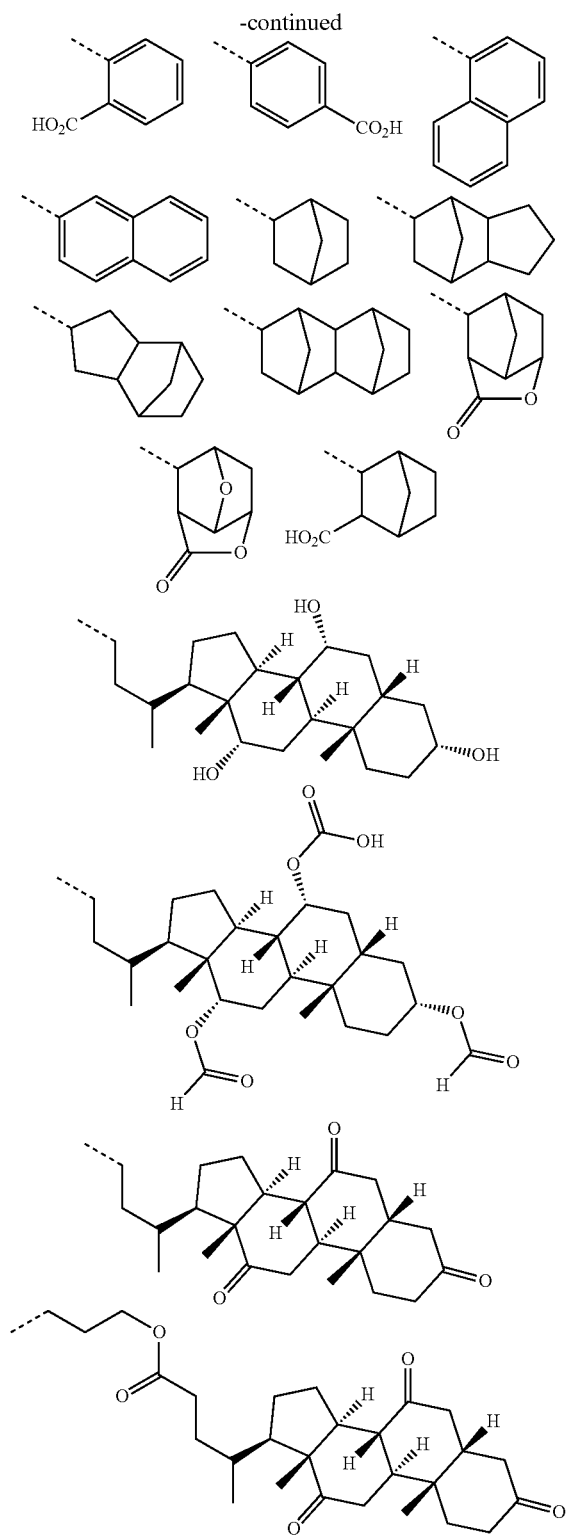

—C(=O)NH— intervenes in any carbon-carbon bond, or any hydrogen atom is substituted by a functionality such as —OH, —NH₂, —CHO or —CO₂H.

An appropriate amount of component (B) is 0.5 to 10 parts by weight per 100 parts by weight of component (A) because this range of component (B) ensures to take full advantage of the invention.

The weight ratio of the sulfonium salt of formula (3) to the sulfonium salt of formula (4) is 0.1 to 50.

The positive resist composition further comprises (C) a solvent. Any organic solvent may be used as component (C) as long as the resin (A), sulfonium salts (B) and other additives are soluble therein. With the organic solvent included, the resist composition becomes easier to apply to the substrate or the like. Exemplary solvents include ketones such as cyclohexanone and methyl-2-n-pentyl ketone; alcohols such as 3-methoxybutanol, 3-methyl-3-methoxybutanol, 1-methoxy-2-propanol, 1-ethoxy-2-propanol, and diacetone alcohol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture. Inter alia, diethylene glycol dimethyl ether, 1-ethoxy-2-propanol, PGMEA, and mixtures thereof are preferred because the acid generator is most soluble therein.

An appropriate amount of component (C) is 200 to 5,000 parts by weight, more preferably 400 to 4,000 parts by weight per 100 parts by weight of component (A).

To the resist composition, a compound which is decomposed with an acid to generate another acid, that is, acid amplifier compound may be added. For this compound, reference should be made to JP-A 2009-269953. In the resist composition, an appropriate amount of the acid amplifier compound is up to 2 parts, and especially up to 1 part by weight per 100 parts by weight of the base resin. An amount of the acid amplifier compound which is up to 2 parts eliminates the risk of making diffusion control difficult and hence, the risk of resolution and pattern profile being degraded.

To the positive resist composition, an organic acid derivative or a compound having a Mw of up to 3,000 which changes its solubility in alkaline developer under the action of an acid, also referred to as dissolution inhibitor, may be added. Reference may be made to JP-A 2009-269953. By blending the dissolution inhibitor, the difference in dissolution rate between exposed and unexposed regions may be accordingly increased, and the resolution be further improved.

To the positive resist composition, a basic compound may be added. By blending the basic compound, the resist composition may be further improved in resolution. Suitable basic compounds include primary, secondary and tertiary amine compounds, specifically amine compounds having hydroxyl, ether, ester, lactone ring, cyano or sulfonic acid ester as described in JP-A 2008-111103, paragraphs [0146]-[0164] (U.S. Pat. No. 7,537,880), and carbamate compounds as described in JP-A 2001-166476. An appropriate amount of the basic compound is 0 to 4 parts by weight per 100 parts by weight of the base resin. When used, the amount of the basic compound is preferably at least 0.1 part by weight.

Examples of group $R^7$ in formula (4) include methyl, ethyl, n-propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl. Also included are substituted forms of the foregoing in which a heteroatom group such as —O—, —S—, —SO—, —SO₂—, —NH—, —C(=O)—, —C(=O)O— or To the positive resist composition, a surfactant may be added. Although the surfactant used herein is not particularly limited, alkali-soluble surfactants as described in JP-A 2008-122932 may be used. When added, the surfactant is effective for facilitating or controlling the coating step of the resist composition. It is acceptable to use a mixture of surfactants. An appropriate (total) amount of the surfactant(s) added is 0.001 to 20 parts, more preferably 0.01 to 10 parts by weight per 100 parts by weight of the base resin.

Also a polymeric additive may be added to the positive resist composition for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590 and JP-A 2008-111103. The water repellency improver to be added to the resist composition should be soluble in the developer and the organic solvent. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and any hole pattern opening failure after development. An appropriate amount of the water repellency improver is 0.1 to 20 parts, preferably 0.5 to 10 parts by weight per 100 parts by weight of the base resin.

Process

The positive resist composition as formulated above is effective in forming a pattern of satisfactory profile at a high resolution by a conventional lithography process including patternwise exposure and development (inclusive of multi-layer resist process), and particularly by the immersion lithography process including formation of a protective film on a resist film and exposure of the resist film via water.

Another embodiment of the invention is a pattern forming process comprising the steps of applying onto a substrate a positive resist composition comprising (A) a resin comprising acid labile group-containing recurring units having formulae (1) and (2) such that the resin may increase its alkali solubility under the action of acid, (B) a mixture of sulfonium salts having formulae (3) and (4), and (C) a solvent, baking to form a photoresist film, forming a protective film on the photoresist film, exposing the photoresist film to high-energy radiation of wavelength 180 to 250 nm through water by immersion lithography, and developing the resist film in an alkaline developer. The formulae (1), (2), (3) and (4) are as defined above.

Pattern formation using the positive resist composition may be performed by well-known lithography processes. For example, the resist composition is applied to a substrate by a suitable coating technique such as spin coating, and prebaked on a hot plate at a temperature of 60 to 150° C. for 1 to 10 minutes, preferably at 80 to 140° C. for 1 to 5 minutes to form a photoresist film having a thickness of 0.05 to 2.0 μm. The substrate used herein may be a substrate for integrated circuitry fabrication (e.g., Si, $SiO_2$, SiN, SiON, TiN, WSi, BPSG, SOG, organic antireflective film, etc.) or a substrate for mask circuitry fabrication (e.g., Cr, CrO, CrON, MoSi, etc.).

Then a protective film which is water insoluble is formed on the photoresist film. The water-insoluble protective film is to prevent the resist film from being leached and to improve water slippage at the film surface. It is generally divided into two types. The first type is an organic solvent-strippable protective coating which must be stripped, prior to alkaline development, with an organic solvent in which the resist film is not dissolvable. The second type is an alkali-soluble protective coating which is soluble in an alkaline developer so that it can be removed simultaneously with the removal of solubilized areas of the resist film.

The protective coating of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof, as exemplified in JP-A 2007-297590 and JP-A 2008-111103. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a solution, from which the protective film of the second type is formed.

The pattern forming process may involve any additional steps. For example, after formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film after exposure.

Next, a mask having a desired pattern is disposed over the substrate, water is held between the mask and the substrate, and the resist film is exposed to high-energy radiation of wavelength 180 to 250 nm such as deep-UV or excimer laser by the immersion lithography. An appropriate exposure dose is in the range of 1 to 200 $mJ/cm^2$, more preferably 10 to 100 $mJ/cm^2$. The positive resist composition of the invention is best suited for micropatterning using deep-UV or excimer laser radiation of wavelength 180 to 250 nm.

The resist film is then baked (PEB) on a hot plate at 60 to 150° C. for 1 to 5 minutes, and preferably at 80 to 140° C. for 1 to 3 minutes. Finally, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. In this way the desired pattern is formed on the substrate.

EXAMPLE

Examples are given below by way of illustration and not by way of limitation.

A series of resins were used in the test. Table 1 shows the compositional ratio (molar ratio) of recurring units incorporated in these resins and their molecular weight (Mw). Notably, the molecular weight Mw is measured by GPC versus polystyrene standards. Table 2 shows the structure of respective recurring units. Among the resins in Table 1, Resins P1 to P9 correspond to the resin as essential component (A) in the inventive resist composition.

TABLE 1

| Resin | Unit 1 (molar ratio) | Unit 2 (molar ratio) | Unit 3 (molar ratio) | Unit 4 (molar ratio) | Mw |
|---|---|---|---|---|---|
| P1 | A-1 (0.25) | A-8 (0.15) | L-1 (0.60) | — | 8,500 |
| P2 | A-1 (0.25) | A-8 (0.25) | L-1 (0.50) | — | 8,100 |
| P3 | A-1 (0.15) | A-8 (0.35) | L-1 (0.50) | — | 9,000 |
| P4 | A-1 (0.25) | A-8 (0.25) | L-3 (0.50) | — | 9,100 |

TABLE 1-continued
| Resin | Unit 1 (molar ratio) | Unit 2 (molar ratio) | Unit 3 (molar ratio) | Unit 4 (molar ratio) | Mw |
|---|---|---|---|---|---|
| P5 | A-1 (0.30) | A-9 (0.10) | L-1 (0.60) | — | 8,800 |
| P6 | A-2 (0.25) | A-8 (0.25) | L-1 (0.50) | — | 8,000 |
| P7 | A-1 (0.25) | A-9 (0.25) | L-3 (0.50) | — | 9,000 |
| P8 | A-1 (0.30) | A-8 (0.10) | L-1 (0.50) | L-3 (0.10) | 8,700 |
| P9 | A-1 (0.25) | A-8 (0.15) | A-9 (0.10) | L-1 (0.50) | 8,500 |
| P10 | A-1 (0.25) | A-4 (0.25) | L-1 (0.50) | — | 7,900 |
| P11 | A-2 (0.25) | A-5 (0.25) | L-1 (0.50) | — | 7,500 |
| P12 | A-1 (0.25) | A-6 (0.25) | L-1 (0.50) | — | 8,000 |
| P13 | A-1 (0.25) | A-4 (0.25) | L-2 (0.50) | — | 8,800 |
| P14 | A-1 (0.25) | A-7 (0.25) | L-1 (0.50) | — | 7,800 |
| P15 | A-1 (0.15) | A-4 (0.35) | L-1 (0.50) | — | 7,600 |
| P16 | A-1 (0.15) | A-8 (0.35) | L-1 (0.50) | — | 7,300 |
| P17 | A-1 (0.50) | L-1 (0.25) | H-1 (0.25) | — | 7,900 |
| P18 | A-2 (0.50) | L-1 (0.25) | H-1 (0.25) | — | 7,100 |
| P19 | A-1 (0.40) | A-4 (0.15) | L-4 (0.45) | — | 8,100 |
| P20 | A-1 (0.25) | A-8 (0.25) | L-4 (0.50) | — | 8,300 |
| P21 | A-1 (0.25) | A-10 (0.25) | L-4 (0.50) | — | 8,500 |
| P22 | A-1 (0.25) | A-2 (0.20) | L-4 (0.30) | H-1 (0.25) | 8,000 |
| P23 | A-1 (0.25) | A-8 (0.20) | L-1 (0.20) | L-4 (0.30) | 8,300 |
| P24 | A-1 (0.30) | A-8 (0.15) | L-1 (0.30) | L-5 (0.25) | 8,600 |
TABLE 2
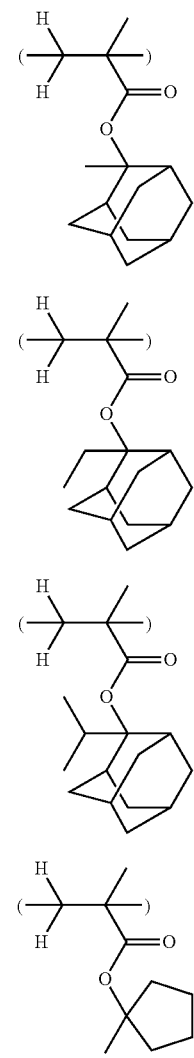

TABLE 2-continued

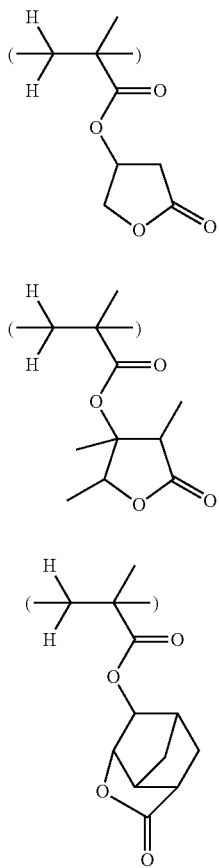

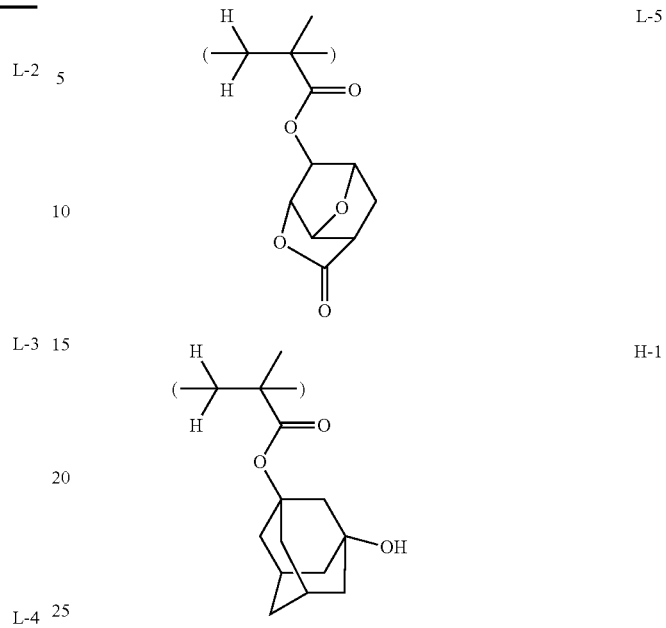

Preparation of Resist Composition

A resist composition in solution form was prepared by dissolving a resin, acid generator, and quencher (or basic compound) in an organic solvent in accordance with the formulation (pbw) of Table 3, and filtering through a Teflon® filter with a pore size of 0.2 μm.

Table 4 shows the structure of the acid generators (S-1 to 5) and basic compounds (Q-1 to 4). In Table 4, sulfonium salts S-1 and S-4 correspond to the sulfonium salts as essential component (B) in the inventive resist composition. In Table 3, resists R1 to R14 correspond to inventive resist compositions whereas resists R15 to R40 correspond to comparative resist compositions.

TABLE 3

| Resist | Resin (pbw) | Acid generator 1 (pbw) | Acid generator 2 (pbw) | Basic compound (pbw) | Organic solvent 1 (pbw) | Organic solvent 2 (pbw) |
|---|---|---|---|---|---|---|
| R1 | P1(80) | S-1(5) | S-4(5) | — | PGMEA(1,650) | GBL(720) |
| R2 | P2(80) | S-1(5) | S-4(5) | — | PGMEA(1,650) | GBL(720) |
| R3 | P3(80) | S-1(5) | S-4(5) | — | PGMEA(1,650) | GBL(720) |
| R4 | P4(80) | S-1(5) | S-4(5) | — | PGMEA(1,650) | GBL(720) |
| R5 | P5(80) | S-1(5) | S-4(5) | — | PGMEA(1,650) | GBL(720) |
| R6 | P6(80) | S-1(5) | S-4(5) | — | PGMEA(1,650) | GBL(720) |
| R7 | P7(80) | S-1(5) | S-4(5) | — | PGMEA(1,650) | GBL(720) |
| R8 | P8(80) | S-1(5) | S-4(5) | — | PGMEA(1,650) | GBL(720) |
| R9 | P9(80) | S-1(5) | S-4(5) | — | PGMEA(1,650) | GBL(720) |
| R10 | P2(80) | S-1(5) | S-4(7) | — | PGMEA(1,650) | GBL(720) |
| R11 | P2(80) | S-1(5) | S-4(10) | — | PGMEA(1,650) | GBL(720) |
| R12 | P2(80) | S-1(7) | S-4(5) | — | PGMEA(1,650) | GBL(720) |
| R13 | P2(80) | S-1(10) | S-4(5) | — | PGMEA(1,650) | GBL(720) |
| R14 | P2(80) | S-1(5) | S-4(5) | Q-3(0.5) | PGMEA(1,650) | GBL(720) |
| R15 | P2(80) | S-2(5) | S-4(5) | — | PGMEA(1,650) | GBL(720) |
| R16 | P2(80) | S-3(5) | S-4(5) | — | PGMEA(1,650) | GBL(720) |
| R17 | P2(80) | S-5(10) | — | Q-1(1.0) | PGMEA(1,650) | GBL(720) |
| R18 | P2(80) | S-1(10) | — | Q-1(1.0) | PGMEA(1,650) | GBL(720) |
| R19 | P2(80) | S-1(10) | — | Q-2(1.0) | PGMEA(1,650) | GBL(720) |
| R20 | P2(80) | S-1(10) | — | Q-3(1.0) | PGMEA(1,650) | GBL(720) |
| R21 | P10(80) | S-1(5) | S-4(5) | — | PGMEA(1,650) | GBL(720) |
| R22 | P11(80) | S-1(5) | S-4(5) | — | PGMEA(1,650) | GBL(720) |
| R23 | P12(80) | S-1(5) | S-4(5) | — | PGMEA(1,650) | GBL(720) |
| R24 | P13(80) | S-1(5) | S-4(5) | — | PGMEA(1,650) | GBL(720) |
| R25 | P14(80) | S-1(5) | S-4(5) | — | PGMEA(1,650) | GBL(720) |
| R26 | P15(80) | S-1(5) | S-4(5) | — | PGMEA(1,650) | GBL(720) |
| R27 | P16(80) | S-1(5) | S-4(5) | — | PGMEA(1,650) | GBL(720) |

TABLE 3-continued
| Resist | Resin (pbw) | Acid generator 1 (pbw) | Acid generator 2 (pbw) | Basic compound (pbw) | Organic solvent 1 (pbw) | Organic solvent 2 (pbw) |
|---|---|---|---|---|---|---|
| R28 | P17(80) | S-1(5) | S-4(5) | — | PGMEA(1,650) | GBL(720) |
| R29 | P18(80) | S-1(5) | S-4(5) | — | PGMEA(1,650) | GBL(720) |
| R30 | P19(80) | S-1(5) | S-4(5) | — | PGMEA(1,650) | GBL(720) |
| R31 | P20(80) | S-1(5) | S-4(5) | — | PGMEA(1,650) | GBL(720) |
| R32 | P19(80) | S-1(5) | S-4(7) | — | PGMEA(1,650) | GBL(720) |
| R33 | P19(80) | S-1(5) | S-4(10) | — | PGMEA(1,650) | GBL(720) |
| R34 | P19(80) | S-1(7) | S-4(5) | — | PGMEA(1,650) | GBL(720) |
| R35 | P19(80) | S-1(10) | S-4(5) | — | PGMEA(1,650) | GBL(720) |
| R36 | P19(80) | S-5(10) | — | Q-1(1.0) | PGMEA(1,650) | GBL(720) |
| R37 | P21(80) | S-1(5) | S-4(5) | — | PGMEA(1,650) | GBL(720) |
| R38 | P22(80) | S-1(5) | S-4(5) | — | PGMEA(1,650) | GBL(720) |
| R39 | P23(80) | S-1(5) | S-4(5) | — | PGMEA(1,650) | GBL(720) |
| R40 | P24(80) | S-1(5) | S-4(5) | Q-4(1.0) | PGMEA(1,650) | GBL(720) |
TABLE 4
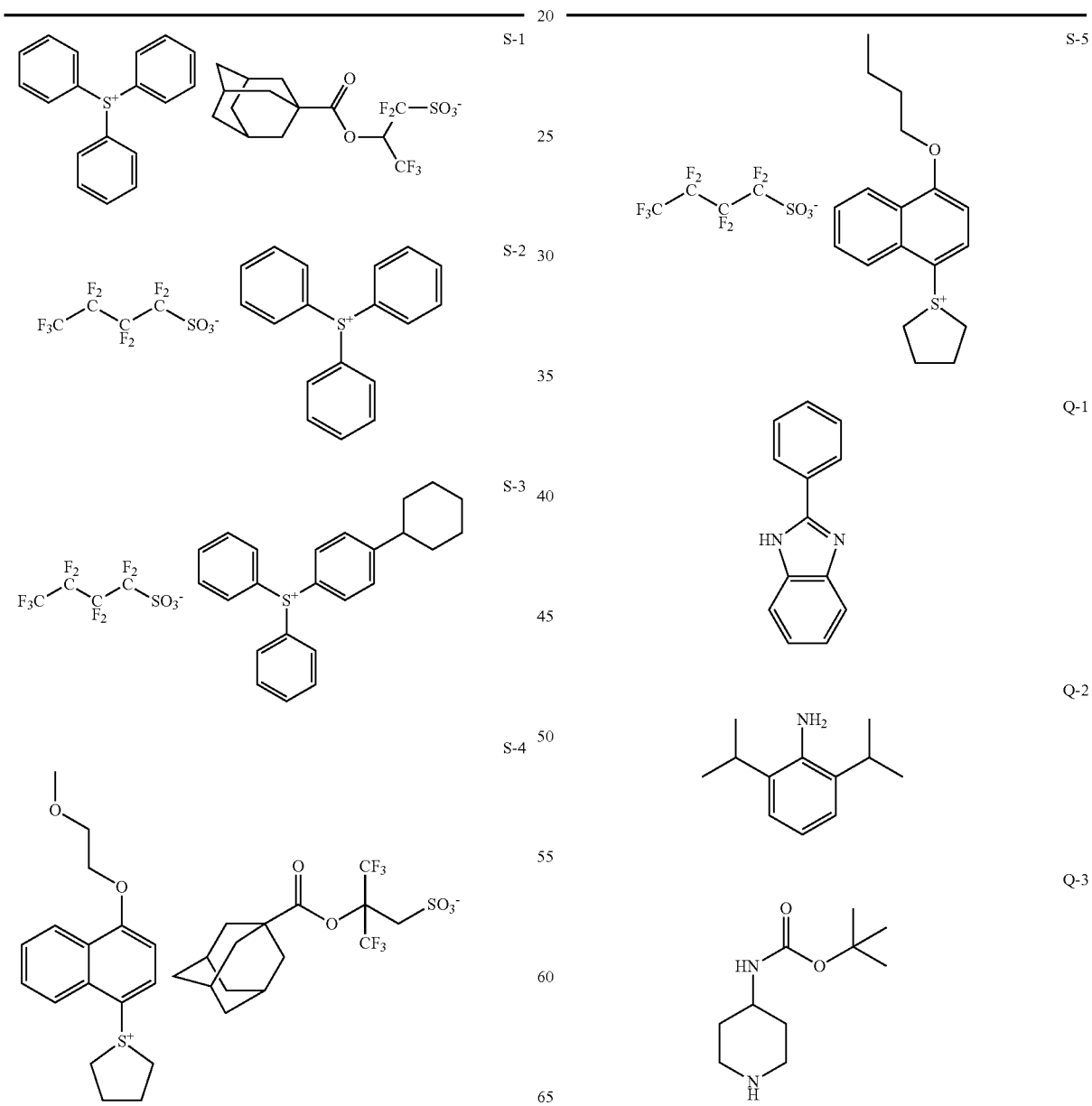

TABLE 4-continued

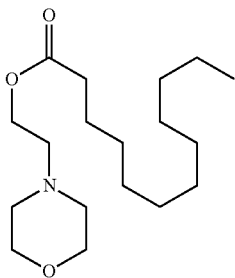 [SMILES: CCCCCCCCCCCC(=O)OCCN1CCOCC1]

Q-4

The solvents in Table 3 are identified below. PGMEA: propylene glycol monomethyl ether acetate GBL: γ-butyrolactone Preparation of Protective Film A top coat or protective film-forming material (TC-1, TC-2) was prepared by mixing a base polymer (TC polymer 1, 2) with an organic solvent in accordance with the following formulation, dissolving, and filtering through a Teflon® filter with a pore size of 0.2 μm.

TC-1: Mixing Formulation

| TC polymer 1 | 100 pbw |
| Organic solvent 1 | 2,600 pbw |
| Organic solvent 2 | 260 pbw |

TC-2: Mixing Formulation

| TC polymer 2 | 100 pbw |
| Organic solvent 1 | 2,600 pbw |
| Organic solvent 2 | 260 pbw |

These components are identified below. The base polymers have the following structural formula.

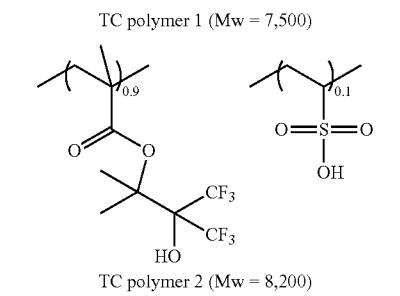

Organic Solvent 1: Isopentyl Alcohol
Organic Solvent 2: 2-methyl-1-butanol

Examples 1 to 14 and Comparative Examples 1 to 26

On a silicon substrate, an antireflective coating solution (ARC-29A by Nissan Chemical Industries, Ltd.) was coated and baked at 200° C. for 60 seconds to form an ARC of 100 nm thick. The resist solution (R1 to R40) was spin coated onto the ARC on the substrate and baked on a hot plate at 100° C. for 60 seconds to form a photoresist film of 100 nm thick.

The protective film-forming material (TC-1, TC-2) was coated onto the resist film and baked at 100° C. for 60 seconds to form a protective film of 50 nm thick. Using an ArF excimer laser scanner (NSR-S610C by Nikon Corp., NA 1.30, σ 0.984, 4/5 annular illumination, cross pole (opening angle) 35°), 6% halftone phase shift mask), the resist film was subjected to immersion exposure and baked (PEB) for 60 seconds at the temperature shown in Tables 5 and 6. The resist film was developed in a 2.38 wt % aqueous solution of tetramethylammonium hydroxide for 60 seconds, forming a pattern.

Resist evaluation was made on a grouped pattern of 50 nm line/100 nm pitch. On observation under an electron microscope, the optimum exposure dose (Eop) was defined as an exposure dose (mJ/cm$^2$) which provided a line width of 45 nm. The pattern at the optimum dose was measured for roughness (LWR). While the focus was vertically shifted with the optimum dose fixed, the range (nm) of focus over which the grouped pattern could be resolved to a target size of 45 nm±10% (i.e., 41 nm to 50 nm) was determined and reported as DOF-1. A larger value of DOF-1 indicates a wider margin relative to a focal shift, i.e., better performance.

Resist evaluation was also made on an isolated pattern of 160 nm line/1,760 nm pitch. While the focus was vertically shifted, the range (nm) of focus over which the isolated pattern could be resolved to a target size of 100 nm±10% (i.e., 90 nm to 110 nm) was determined and reported as DOF-2.

Table 5 shows the test results (Examples 1 to 14) of the inventive resist compositions R1 to R14 in Table 3. Table 6 shows the test results (Comparative Examples 1 to 26) of the comparative resist compositions R15 to R40 in Table 3.

TABLE 5

| Example | Resist | Protective film | DOF-1 (nm) | DOF-2 (nm) | LWR (nm) |
|---|---|---|---|---|---|
| 1 | R1 | TC-1 | 160 | 60 | 3.5 |
| 2 | R2 | TC-1 | 180 | 80 | 3.2 |
| 3 | R3 | TC-1 | 240 | 100 | 3.0 |
| 4 | R4 | TC-1 | 200 | 80 | 3.3 |
| 5 | R5 | TC-1 | 200 | 60 | 2.8 |
| 6 | R6 | TC-1 | 200 | 70 | 3.3 |
| 7 | R7 | TC-1 | 220 | 60 | 2.8 |
| 8 | R8 | TC-1 | 200 | 80 | 3.2 |
| 9 | R9 | TC-1 | 200 | 70 | 3.0 |
| 10 | R10 | TC-1 | 200 | 100 | 3.0 |
| 11 | R11 | TC-1 | 180 | 100 | 2.9 |
| 12 | R12 | TC-1 | 200 | 100 | 3.1 |
| 13 | R13 | TC-2 | 200 | 100 | 3.0 |
| 14 | R14 | TC-1 | 200 | 90 | 3.3 |

TABLE 6

| Comparative Example | Resist | Protective film | DOF-1 (nm) | DOF-2 (nm) | LWR (nm) |
|---|---|---|---|---|---|
| 1 | R15 | TC-1 | 140 | 40 | 4.0 |
| 2 | R16 | TC-1 | 140 | 40 | 4.2 |
| 3 | R17 | TC-2 | 160 | 40 | 4.4 |
| 4 | R18 | TC-2 | 140 | 40 | 4.2 |
| 5 | R19 | TC-2 | 140 | 40 | 4.0 |
| 6 | R20 | TC-2 | 140 | 40 | 4.1 |
| 7 | R21 | TC-1 | 140 | 40 | 3.8 |
| 8 | R22 | TC-1 | 160 | 60 | 4.0 |
| 9 | R23 | TC-1 | 140 | 40 | 3.4 |
| 10 | R24 | TC-1 | 160 | 60 | 4.1 |
| 11 | R25 | TC-1 | 140 | 40 | 3.9 |
| 12 | R26 | TC-1 | 140 | 40 | 3.9 |
| 13 | R27 | TC-1 | 160 | 40 | 4.1 |
| 14 | R28 | TC-1 | 120 | 40 | 4.2 |
| 15 | R29 | TC-1 | 140 | 60 | 4.0 |
| 16 | R30 | TC-1 | 120 | 40 | 3.8 |
| 17 | R31 | TC-1 | 140 | 40 | 4.2 |
| 18 | R32 | TC-1 | 140 | 60 | 3.7 |
| 19 | R33 | TC-1 | 120 | 60 | 3.6 |
| 20 | R34 | TC-1 | 140 | 60 | 3.7 |
| 21 | R35 | TC-2 | 140 | 60 | 3.6 |
| 22 | R36 | TC-2 | 140 | 40 | 4.6 |
| 23 | R37 | TC-1 | 140 | 40 | 3.8 |
| 24 | R38 | TC-1 | 120 | 60 | 4.1 |
| 25 | R39 | TC-1 | 120 | 60 | 3.9 |
| 26 | R40 | TC-1 | 140 | 60 | 3.8 |

As is evident from Tables 5 and 6, the positive resist compositions within the scope of the invention show substantial improvements in DOF and LWR.

While the invention has been illustrated and described in typical embodiments, it is not intended to be limited to the details shown. Any modified embodiments having substantially the same features and achieving substantially the same results as the technical idea disclosed herein are within the spirit and scope of the invention.

Japanese Patent Application No. 2015-094749 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising (A) a resin comprising acid labile group-containing recurring units so that the resin may increase its alkali solubility under the action of acid, (B) a sulfonium salt, and (C) a solvent, the resin as component (A) consisting of recurring units having the general formula (1), recurring units having the general formula (2) as the acid labile group-containing recurring units, and recurring units having the general formula (5),

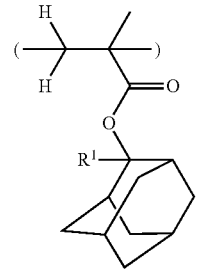
(1)

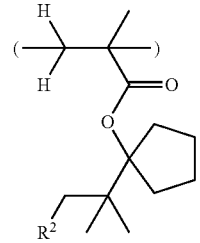
(2)

wherein $R^1$ is methyl or ethyl, and $R^2$ is hydrogen or methyl,

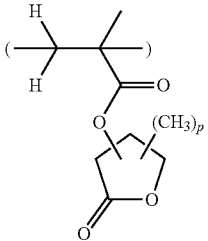
(5)

wherein p is 0, 1 or 2, component (B) being a mixture of a sulfonium salt having the general formula (3) and a sulfonium salt having the general formula (4):

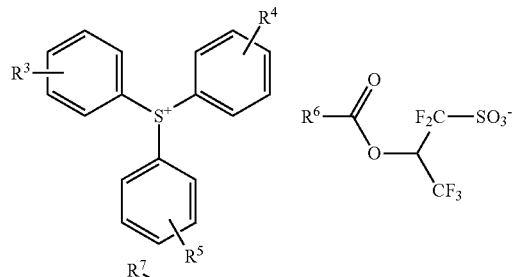
(3)

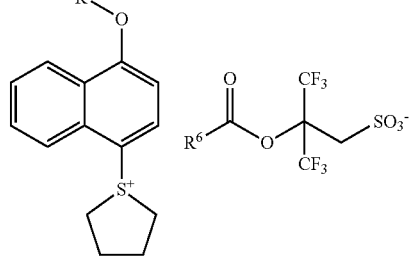
(4)

wherein $R^3$, $R^4$ and $R^5$ are each independently hydrogen or a straight, branched or cyclic $C_1$-$C_{20}$ monovalent hydrocarbon group which may contain a heteroatom, $R^6$ is each independently a straight, branched or cyclic $C_7$-$C_{30}$ monovalent hydrocarbon group which may contain a heteroatom, and $R^7$ is each independently hydrogen or a straight, branched or cyclic $C_1$-$C_{30}$ monovalent hydrocarbon group which may contain a heteroatom.

2. The resist composition of claim 1 wherein component (B) is present in an amount of 0.5 to 10 parts by weight per 100 parts by weight of component (A).

3. The resist composition of claim 1 wherein $R^2$ is methyl.

4. The resist composition of claim 1 wherein $R^1$ is ethyl.

5. The resist composition of claim 1 wherein $R^6$ is a group selected from the group consisting of the following formulae:

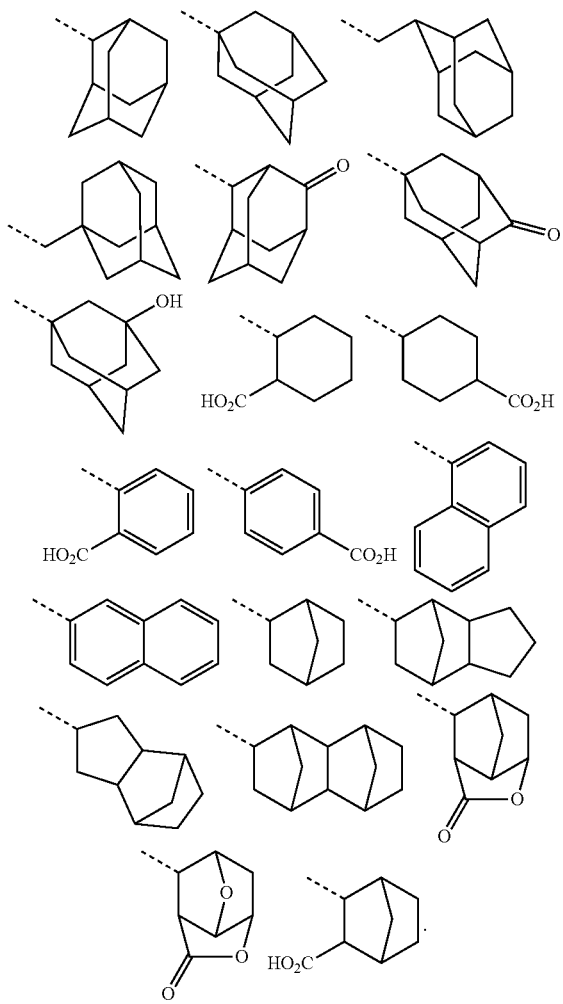

6. A pattern forming process comprising the steps of applying a positive resist composition onto a substrate, baking to form a resist film, forming a protective film on the resist film, exposing the resist film to high-energy radiation of wavelength 180 to 250 nm through water by immersion lithography, and developing the resist film in an alkaline developer, said positive resist composition comprising (A) a resin comprising acid labile group-containing recurring units so that the resin may increase its alkali solubility under the action of acid, (B) a sulfonium salt, and (C) a solvent, the resin as component (A) comprising recurring units having the general formula (1) and recurring units having the general formula (2) as the acid labile group-containing recurring units,

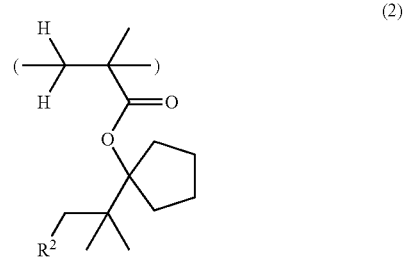

wherein $R^1$ is methyl or ethyl, and $R^2$ is hydrogen or methyl, component (B) being a mixture of a sulfonium salt having the general formula (3) and a sulfonium salt having the general formula (4):

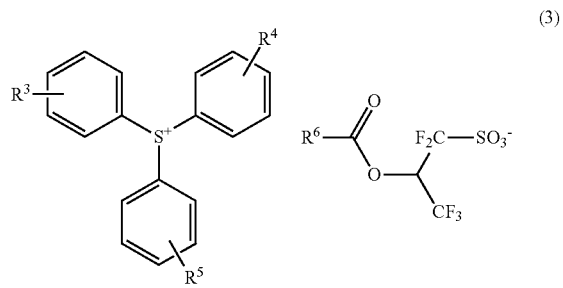

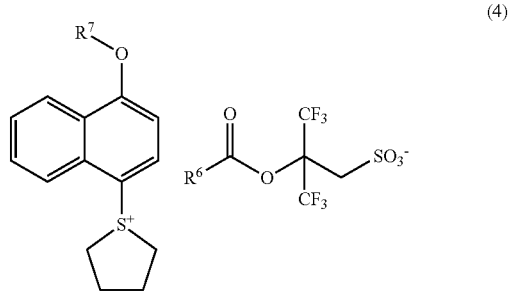

wherein $R^3$, $R^4$ and $R^5$ are each independently hydrogen or a straight, branched or cyclic $C_1$-$C_{20}$ monovalent hydrocarbon group which may contain a heteroatom, $R^6$ is each independently a straight, branched or cyclic $C_7$-$C_{30}$ monovalent hydrocarbon group which may contain a heteroatom, and $R^7$ is each independently hydrogen or a straight, branched or cyclic $C_1$-$C_{30}$ monovalent hydrocarbon group which may contain a heteroatom.

7. The process of claim 6 wherein the resin as component (A) further comprises recurring units having the general formula (5):
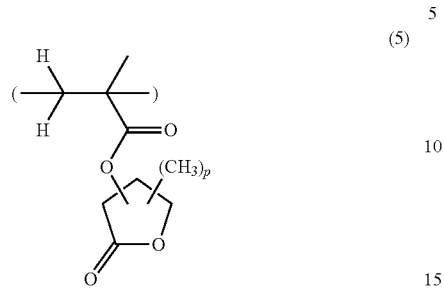
(5)
wherein p is 0, 1 or 2.
8. The process of claim 6 wherein component (B) is present in an amount of 0.5 to 10 parts by weight per 100 parts by weight of component (A).
* * * * *